United States Patent [19]

Shaw

[11] Patent Number: 5,459,421
[45] Date of Patent: Oct. 17, 1995

[54] DYNAMIC-STATIC MASTER SLAVE FLIP-FLOP CIRCUIT

[75] Inventor: Jeng-Jye Shaw, Palo Alto, Calif.

[73] Assignee: Intel Corporation, Santa Clara, Calif.

[21] Appl. No.: 221,361

[22] Filed: Mar. 31, 1994

[51] Int. Cl.[6] .......................... H03K 3/289; H03K 3/356
[52] U.S. Cl. .............................. 327/203; 327/211
[58] Field of Search ..................... 327/203, 211

[56] References Cited

U.S. PATENT DOCUMENTS

| | | | |
|---|---|---|---|
| 4,275,316 | 6/1981 | Knapp | 307/279 |
| 4,864,243 | 9/1989 | Reese | 328/110 |
| 5,248,905 | 9/1993 | Kuo | 307/272.2 |

OTHER PUBLICATIONS

"High–Speed CMOS Circuit Technique", IEEE Journal of Solid–State Cirucuit, Jiren Yuan & Christer Svensson, vol. 24, No. 1, Feb. 1989, pp. 62–70.

Primary Examiner—Margaret Rose Wambach
Attorney, Agent, or Firm—Blakely, Sokoloff, Taylor & Zafman

[57] ABSTRACT

A flip-flop circuit is described which comprises of a dynamic master which stores a signal by maintaining a charge representing the signal. It also comprises of a static slave which stores a signal by switching to a voltage potential representing the signal. A clock line is coupled to the master and the slave carrying a clock signal to control the master and the slave.

61 Claims, 9 Drawing Sheets

DYNAMIC-STATIC MASTER SLAVE FLIP-FLOP CIRCUIT

FIELD OF THE INVENTION

The present invention relates to the field of semiconductor devices. More particularly, the present invention relates to the design of flip-flop circuitry using complementary metal oxide semiconductor field effect transistors (CMOS).

BACKGROUND OF THE INVENTION

Flip-flop circuits are used in semiconductor devices to maintain a binary state indefinitely until directed by an input signal to switch states. A variation of the basic flip-flop circuit, the clocked flip-flop circuit responds to input levels in response to a clock signal. Used in this manner, the clocked flip-flop circuit acts as a sampling device which only reads the information off of its input line when directed to do so by the clocking circuit. After reading the information, the circuit stores the information and outputs it on the output line. In all other instances of time, the circuit will not respond to input signals and will remain unchanged during variations of signal states in the input line.

Despite their usefulness, typical flip-flops have many shortcomings. One such typical flip-flop is the CMOS static flip-flop. The CMOS static flip-flop is relatively slow and occupies a relatively large amount of space. It has a long setup time requirement and has large input loads. Finally, the input node is sensitive to power line noise.

Other typical flip-flops have other disadvantages. One such flip-flop is the CMOS dynamic flip-flop. It loses data when the clock is stopped. In addition, it does not perform well under low frequency operation. Finally, it experiences body effect problems causing difficulties during low voltage operation.

Thus, what is needed is a flip-flop circuit that is fast, occupies a small area, possesses a short setup time, has a small input load, maintains data when the clock is stopped, possesses safety for lower frequency operation, overcomes the body effect problem and has decreased sensitivity to power line noise.

SUMMARY OF THE INVENTION

A novel flip-flop circuit is described. The flip-flop circuit comprises of a dynamic master which stores a signal by maintaining a charge representing the signal. It also comprises of a static slave which stores a signal by switching to a voltage potential representing the signal. A clock line is coupled to the master and the slave carrying a clock signal to control the master and the slave.

In addition, the flip-flop circuit can include a clocked inverter in the static slave which shuts off in response to a clock signal. The flip-flop can also include a delay circuit to delay clock signal changes to the dynamic master. Finally, the flip-flop can include a p logic unit and n logic unit in the dynamic master. The p logic unit and the n logic unit allows logic functions to be incorporated into the flip-flop.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A flip-flop circuit is described. In the following description, the invention is described with reference to specific exemplary embodiment thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

Figure 1:
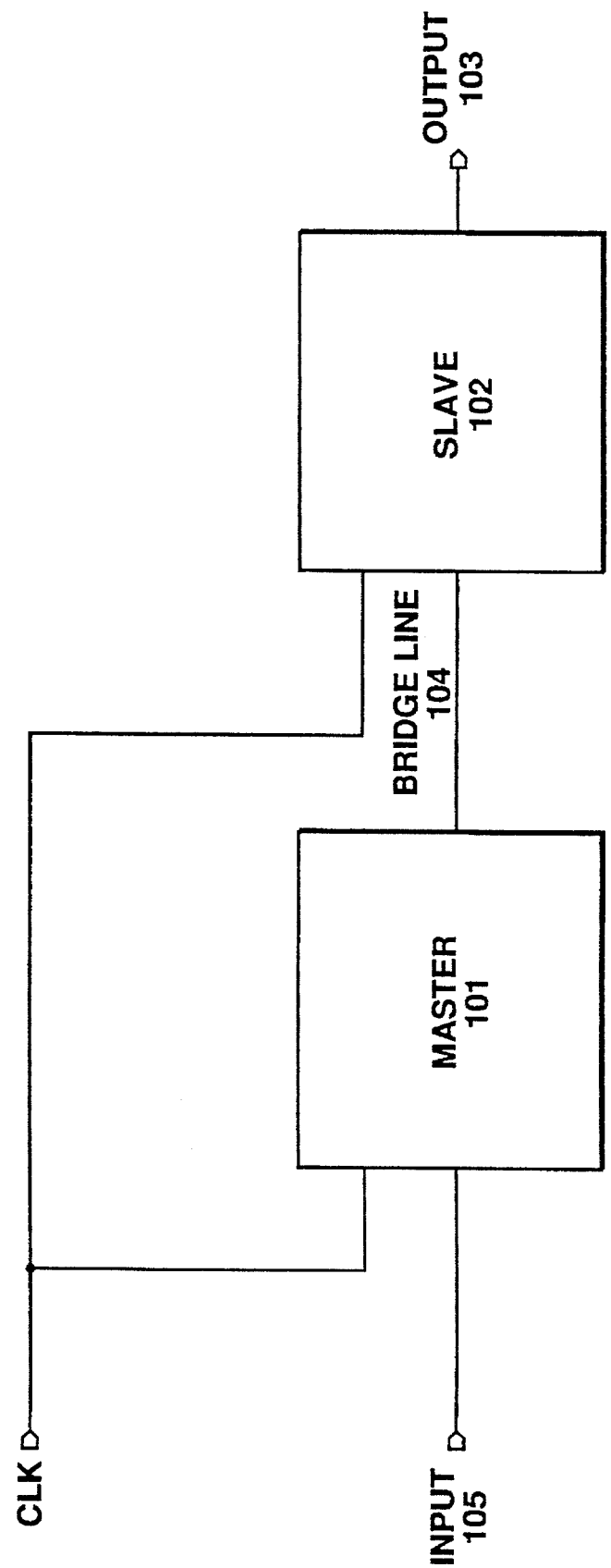
FIG. 1 illustrates in block diagram form a flip-flop circuit.

FIG. 1 illustrates in block diagram form a flip-flop circuit of one embodiment of the present invention. The flip-flop circuit comprises of two portions, a master portion 101 and a slave portion 102. Master portion 101 continually receives input signals from an external source. Upon the receipt of a predetermined clock signal, master portion 101 transmits that signal to slave portion 102. In this embodiment, the predetermined clock signal is the low clock state or binary "0." While the clock signal remains in the low clock state, master portion 101 continually transmits the input signal to slave portion 102. When the input signal changes while the clock signal remains in the low clock state, master portion 101 transmits the changes to slave portion 102. However, when the clock signal switches to the high clock state, master portion 101 stores the last input signal prior to the switch to the high clock state. The last input signal is transmitted to slave portion 102 and continues to be transmitted to slave portion 102 in spite of changes in the input signal. Master portion 101 stores the last input signal by maintaining a charge state on bridge line 104 representing the signal state of the last input signal. When the clock signal switches back to the low clock state, master portion 101 again responds to input signal changes and transmits the changes to slave portion 102.

Like master portion 101, slave portion 102 also continually receives signals, hereafter referred to as bridge signals. However, with slave portion 102, the bridge signals come from master portion 101 and are the same signals transmitted from master portion 101 described previously. Upon the receipt of a predetermined clock signal, slave portion 102 transmits the bridge signal to output line 103. Slave portion 102 also stores the bridge signal by switching to a voltage potential representing the signal state of the bridge signal. In this embodiment, the predetermined clock signal is the high clock state or binary "1." While the clock signal remains in the high clock state, slave portion 102 continually transmits the bridge signal to output line 103. Any change in the signal state of the bridge signal while the clock signal remains in the high clock state will cause slave portion 102 to transmit the changed signal state to output line 103 and to store the changed signal state. When the clock signal switches to the low clock state, slave portion 102 still stores the last bridge signal prior to the switch to the low clock state. The last bridge signal is transmitted to output line 103 and continues to be transmitted to output line 103 in spite of changes in the bridge signal. When the clock signal switches back to the high clock state, slave portion 102 again responds to bridge signal changes and transmits the changes to output line 103.

In this embodiment of the present invention, the clock signal to master portion 101 and slave portion 102 is the same clock signal. Thus, when the clock signal to master portion 101 is in a low clock state, the clock signal to slave portion 102 is also in a low clock state. Similarly, when the clock signal to master portion 101 is in a high clock state, the clock signal to slave portion 102 is also in a high clock state. As described previously, master portion 101 only transmits changes in the input signal when the clock signal is in the low clock state. However, when the clock signal is in the low state, slave portion 102 will not transmit the changes in the bridge signal to output line 103. When the clock signal switches to the high clock state, master portion 101 stores and transmits the last input signal. In the high clock state, slave portion 102 will now store and transmit to output line 103 the bridge signal which in this case is the last input signal. During the duration of the high clock state, slave portion 102 continues to store and transmit to output line 103 the last input signal. When the clock signal switches back to the low clock state, slave portion 102 still continues to store and transmit to output line 103 the last input signal. As described above, slave portion 102 will not transmit the changes in the bridge signal to output line 103. Only when the clock state switches to the high clock state again will slave portion 102 transmit and store a new signal. In this case, the new signal will be the last input signal before the switch in clock state from low to high.

It will be appreciated that the apparatus just described is a positive edge triggered device. The flip-flop circuit transmits the last input signal while the clock signal is in a low clock state and repeats the process every time the clock state returns to the low clock state. In essence, the flip-flop circuit is triggered to transmit the input signal only during the rising edge of the clock signal. It is to be appreciated that different variations of the apparatus can be created incorporating the features of the present invention. One such variation is a negative edge triggered device which can be created by merely switching the predetermined clock signal for master portion 101 from a low clock state to a high clock state and switching the predetermined clock signal for slave portion 102 from a high clock state to a low clock state.

Figure 2:
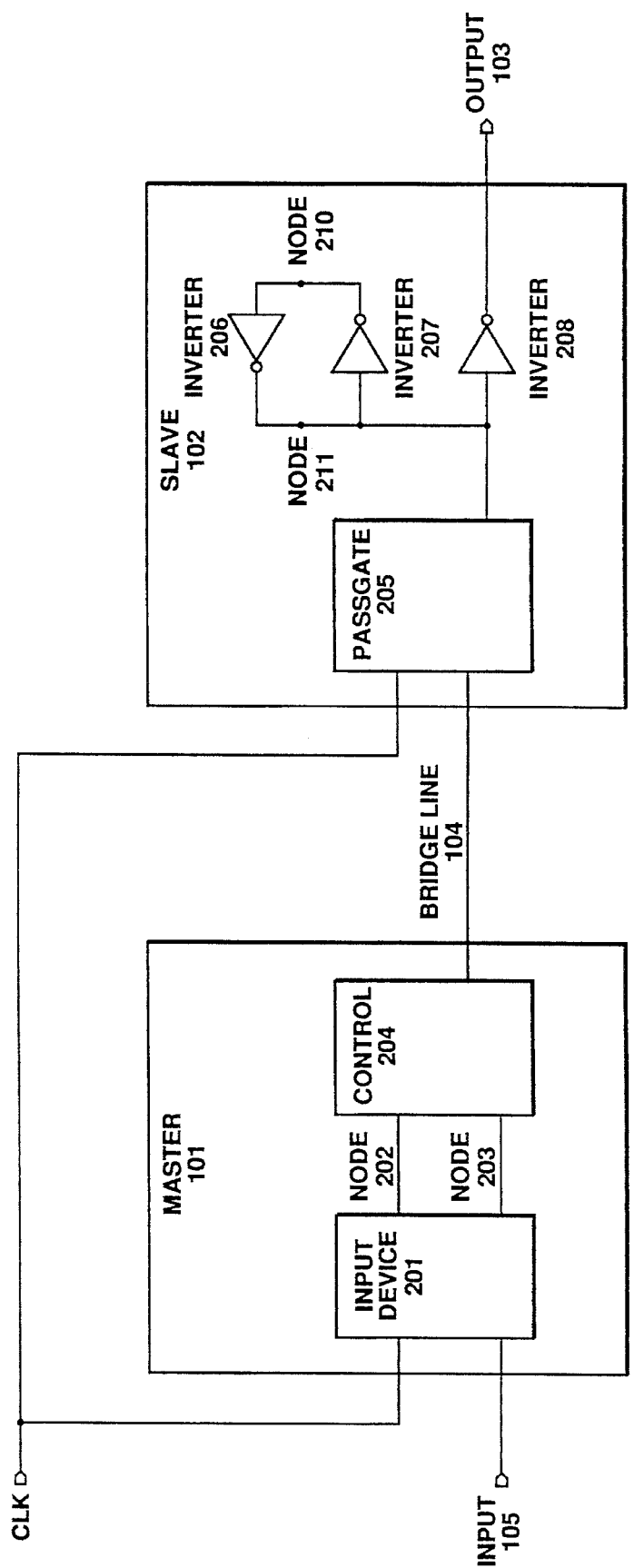
FIG. 2 illustrates in block diagram form the master portion and slave portion of the flip-flop circuit of FIG. 1.

FIG. 2 illustrates in further detail, master portion 101 and slave portion 102 of FIG. 1. Master portion 101 comprises of input device 201, node 202, node 203 and control device 204. Input device 201 continually receives input signals from an external source through input line 105. When the clock signal is in a low clock state, input device 201 charges both node 202 and node 203 to a high charge state in response to an input signal of a low signal state. Input device 201 brings both node 202 and 203 to a low charge state in response to an input signal of a high signal state. On the other hand, when the clock signal is in a high clock state, input device 201 charges node 202 to a high charge state and maintains the existing charge state on node 203 in response to an input signal of a low signal state. Input device 201 maintains the existing charge state on node 202 and brings node 203 to a low charge state in response to an input signal of a high signal state.

The charge states on node 202 and node 203 in turn determines the operation of control device 204. Control device 204 transmits bridge signals in the form of charge states. When both node 202 and node 203 have a high charge state, control device 204 brings bridge line 104 to a low charge state. On the other hand, when both node 202 and node 203 have a low charge state, control device 204 charges bridge line 104 to a high charge state. Finally, when node 202 is in a high charge state and node 203 is in a low charge state, control device 204 maintains the existing charge state on bridge line 104. Thus, considering the operation of input device 201 and control device 204 together, when the clock signal is in a low clock state, the charge state on bridge line 104 reflects the signal state of the input signal. When the clock signal switches to a high clock state, the charge state on bridge line 104 is the existing charge state on bridge line 104. In this case, the existing charge state corresponds to the signal state of the input signal just before the switch of the clock signal from the low clock state to the high clock state. In other words, the existing charge state corresponds to the last input signal before the switch. Consequently, it is to be appreciated that when the clock signal is in a low clock state, master portion 101 transmits the input signal to slave portion 102 by the charge states on bridge line 104. When the clock signal switches to a high clock state, master portion stores the last input signal before the switch by maintaining the corresponding charge state on bridge line 104. It will be appreciated that master portion 101 just described is a dynamic circuit.

Slave portion 102 comprises of pass gate 205, inverter 206, inverter 207, and inverter 208. Pass gate 205 continually receives signals across bridge line 104 in the form of charge states. When the clock signal is in a low clock state, pass gate 205 prevents the signal from passing through. Inverter 207 maintains the existing voltage potential on node 210 and inverter 206 maintains the existing voltage potential on node 211. When the clock signal switches to a high clock state, pass gate 205 allows the signal on bridge line 104 to pass through. The signal causes inverter 207 to apply a voltage potential to node 210 that is inverted from the signal. Thus, when charge state on bridge line 104 is high, inverter 207 applies a low voltage potential to node 210. The low voltage potential on node 210 in turn causes inverter 206 to apply a high voltage potential to node 211. Inverter 208 responds to the high voltage potential on node 211 by applying a low voltage potential to output line 212. On the other hand, when charge state on bridge line 104 is low, inverter 207 applies a high voltage potential to node 210. The high voltage potential on node 210 in turn causes inverter 206 to apply a low voltage potential to node 211. Inverter 208 responds to the low voltage potential on node 211 by applying a high voltage potential to output line 212. In this manner, slave portion 102 switches voltage potentials on node 210 and 211 in response to the signal state on bridge line 104 as represented by the corresponding charge state.

When the clock signal switches back to the low clock state, inverter 207 and inverter 206 maintains the existing voltage potentials on node 210 and node 211 respectively, as described above. As a consequence, inverter 208 also maintains the existing voltage potential on output line 103. The existing voltage potentials on node 210, node 211 and output line 103 are the voltage potentials on the respective items just before the clock signal switches back to the low clock state. In this case, the existing voltage potentials corresponds to the signal state of bridge line 104 just before the switch of the clock signal from the high clock state to the low clock state. It is to be appreciated that when the clock signal is in a high clock state, slave portion 102 transmits the signal on bridge line 104 as represented by the charge state to output line 103 by applying the corresponding voltage potential to output line 103. When the clock signal changes to a low clock state, slave portion 102 stores the signal state on bridge line 104 just before the change by the previous switch to the corresponding voltage potential. It will be appreciated that slave portion 102 just described is a static device.

As described above, the clock signal to master portion 101 and slave portion 102 is the same clock signal. Thus, slave portion 102 only transmits to output line 103 the last input signal before the clock signal changes from a low clock state to a high clock state.

Figure 3:
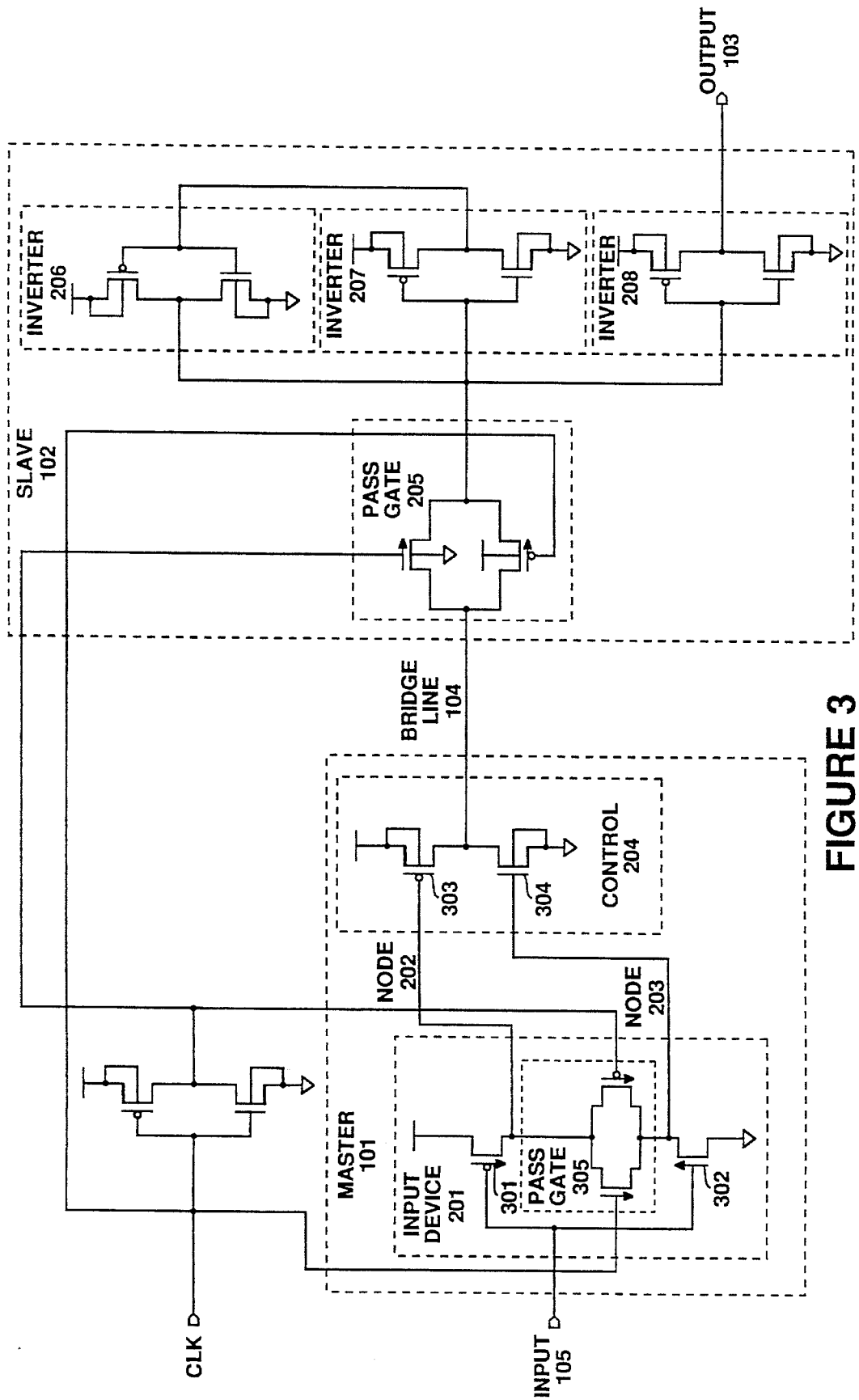
FIG. 3 illustrates in transistor form the flip-flop circuit of FIG. 1.

FIG. 3 illustrates in transistor form a flip-flop circuit of this embodiment of the present invention. Input device 201 comprises of p channel transistor 301 with a source coupled to a high voltage potential and a drain coupled to pass gate 305. Input device 201 also comprises of n channel transistor 302 with a source coupled to a low voltage potential and a drain coupled to pass gate 305. Input line 105 is coupled to the gates of p channel transistor 301 and n channel transistor 302. Control device 204 comprises of p channel transistor 303 and n channel transistor 304. P channel transistor 303 lines a source coupled to a high voltage potential and a drain coupled to n channel transistor 304. N channel transistor 304 has a source coupled to a low voltage potential and a drain coupled to p channel transistor 303. Node 202 is coupled to the gate of p channel transistor 303 and node 203 is coupled to the gate of n channel transistor 304. It will be appreciated that with the present circuit, input line 105 is connected to the gate of a p channel transistor 301 and the gate of a n channel transistor 302. Thus, input line 105 transmits the signal states through the gates of p channel transistor 301 and n channel transistor 302. When power line noise appears on input line 105, it causes voltage fluctuations in the high signal state and low signal state. However, when input line 105 is in the high signal state, node 202 and node 203 will receive the correct charge state as long as the fluctuations do not exceed the noise margin of the circuit. Thus, fluctuations which do not exceed the noise margin will have no effect on the operation of the flip-flop. Similarly, when input line 105 is in the high signal state, node 202 and node 203 will receive the correct charge state as long as the fluctuations do not exceed the noise margin. In this embodiment, the threshold voltage of a p channel transistor 301 and n channel transistor 302 is 4.3–4.5 volts and 0.5–0.7 volts respectively. In addition, the ratio of p channel transistor 301 gate size to n channel transistor 302 gate size is 2.4. Thus, when pass gate 305 is on, the noise margin is approximately half of the high voltage potential of five volts or 2.5 volts. On the other hand, when pass gate 305 is off, the circuit is completely insensitive to input voltage, i.e., the noise margin is greater than the high voltage potential of 5 volts.

On the other hand, in a CMOS static flip-flop, the input line is connected to the drain of a n channel transistor and the source of a p channel transistor. When power line noise appears on the input line of the CMOS static flip-flop, it causes voltage fluctuations in the high signal state and low signal state. If the input line is in the high signal state and voltage fluctuations cause the input line voltage to exceed the high signal voltage by 0.8 volts, the body effect will cause the p channel transistor to turn on even if the clock signal is in the high clock state. Likewise, if the input line is in the low signal state and voltage fluctuations cause the input line voltage to fall below the low signal state voltage by 0.8 volts, the body effect will cause the n channel transistor to turn on even if the clock signal is in the low clock state. When either p channel or n channel transistor turns on inadvertently, the CMOS static flip-flop will store and transmit incorrect information. Thus, in a CMOS static flip-flop, the noise margin is only 0.8 volts. It is considerably lower than the noise margin of 2.5 volts of the flip-flop of the embodiment of the present invention. In addition, the flip-flop of the embodiment of the present invention won't change state when the pass gate is off, even when the input voltage fluctuates many volts above the high voltage potential or below the low voltage potential. As such, the flip-flop is practically insensitive to input noise in the "off" state.

It will be appreciated that with the present circuit, input line 105 is only connected to the gate of a p channel transistor 301 and the gate of a n channel transistor 302. To effect a change to the signal states carried by the circuit, input line 105 only has to change the charge on the two transistors 301 and 302. As a consequence, the capacitance faced by input line 105 is relatively low when compared to a CMOS static flip-flop. The lower capacitance results in a lower input load and also results in a lower setup time requirement which in turn results in greater speed. The speed is also enhanced by master portion 101 storing signal states by maintaining charge states. Master portion 101 thus, eliminates the use back-to-back inverters in the master as in a CMOS static flip-flop. The associated delay with back-to-back inverters and their resistance to changes in signal states is also eliminated. This speed can be utilized by decreasing the size of the transistors in the circuit thus, decreasing the area taken up by the circuit. The decreased size of the transistors also allows the circuit to consume less power. In addition, the present circuit has a relatively small number of transistors, fourteen. The small number of transistors decreases the area taken up by the circuit and allows the circuit to consume even less power.

The present circuit also has slave portion 102 which stores signal states by switching to a voltage potential. Because the switching and storing of the signal state is done independently of the clock signal, slave portion 102 will retain its signal state even when the clock is stopped. Thus, a signal state can be stored in the present circuit even when the clock is stopped allowing the present circuit to function at power-down mode. A CMOS dynamic flip-flop does not have this capability. In addition, because the present circuit retains its signal state when the clock is stopped, it is not as likely to lose data as a CMOS dynamic flip-flop during low clock frequency operation. Finally, the present circuit utilizes a pass gate in both master portion 101 and slave portion 102 to control the circuits instead of a single transistor as in a CMOS dynamic flip-flop. The use of the pass gates allows the present circuit to avoid the body effect problem associated with the single transistor control. Avoiding body effect, in turn allows the present circuit to operate under low voltage conditions.

Figure 4:
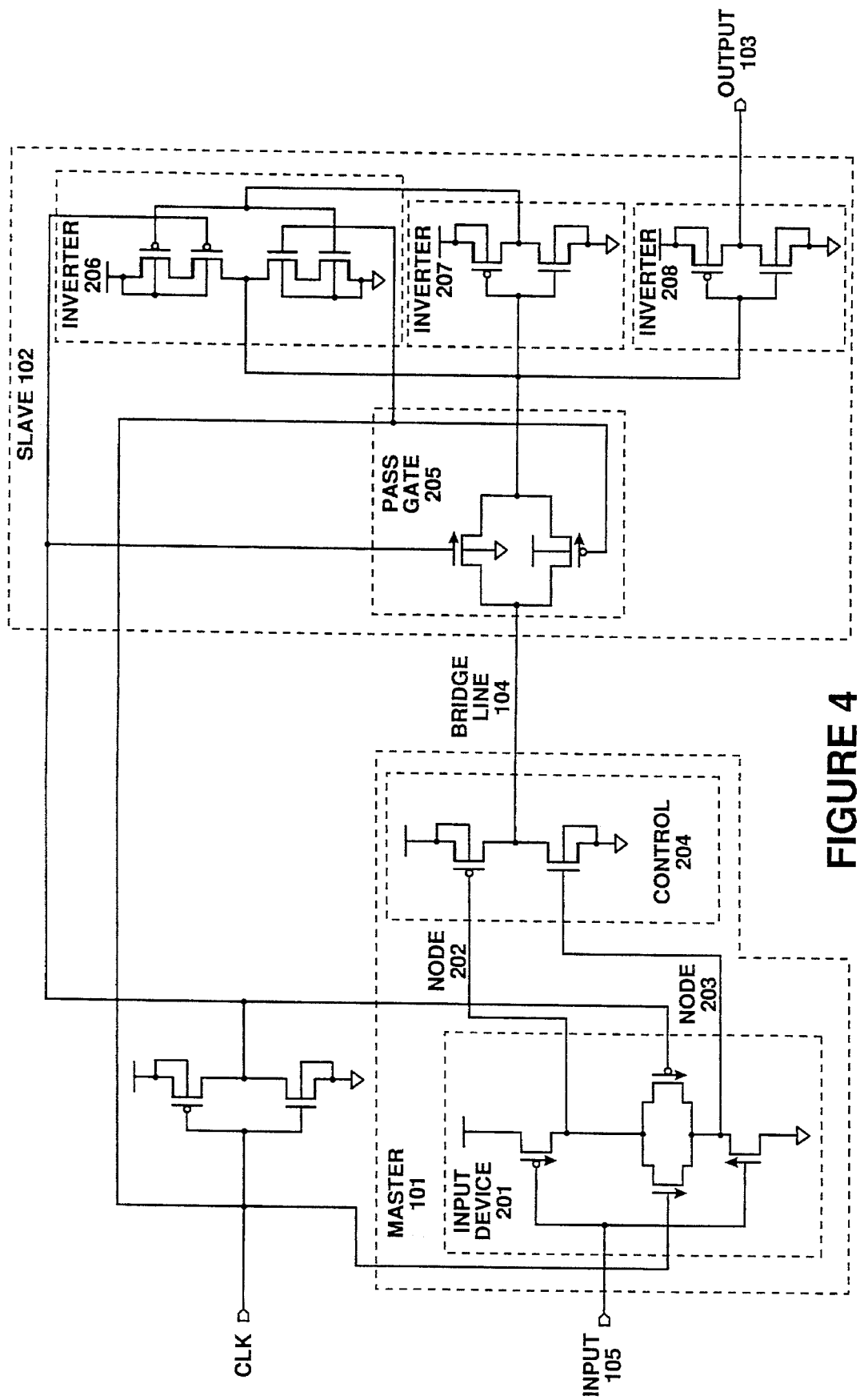
FIG. 4 illustrates in transistor form a flip-flop circuit with a clocked inverter.

Under a second embodiment of the present invention, inverter 206 is a clocked inverter. FIG. 4 illustrates in transistor form the circuit of the second embodiment of the present invention. Here, inverter 206 acts as a regular inverter when the clock signal is in the low clock state. A low voltage potential on node 210 causes clocked inverter 206 to apply a high voltage potential to node 211 and a high voltage potential on node 210 causes clocked inverter 206 to apply a low voltage potential to node 211. However, when the clock signal is in the high clock state, clocked inverter 206 shuts off. Clocked inverter 206 no longer applies a voltage potential to node 211 and node 211 is isolated from both high and low voltage potentials. The voltage potential on node 210 now does not have any effect on node 211. When the clock signal is in the high clock state, pass gate 205 is open allowing the bridge signal to pass through as described above. With the first embodiment though, the bridge signal encounters resistance to signal state changes because the bridge signal has to overcome the voltage potential being applied by the back-to-back inverters 206 and 207. However, with the second embodiment, the resistance to signal state changes is reduced because clocked inverter 206 shuts off in the high clock state. Voltage potential is no longer applied to node 211 as described above thus reducing resistance to signal state changes faced by the bridge signal.

Figure 5:
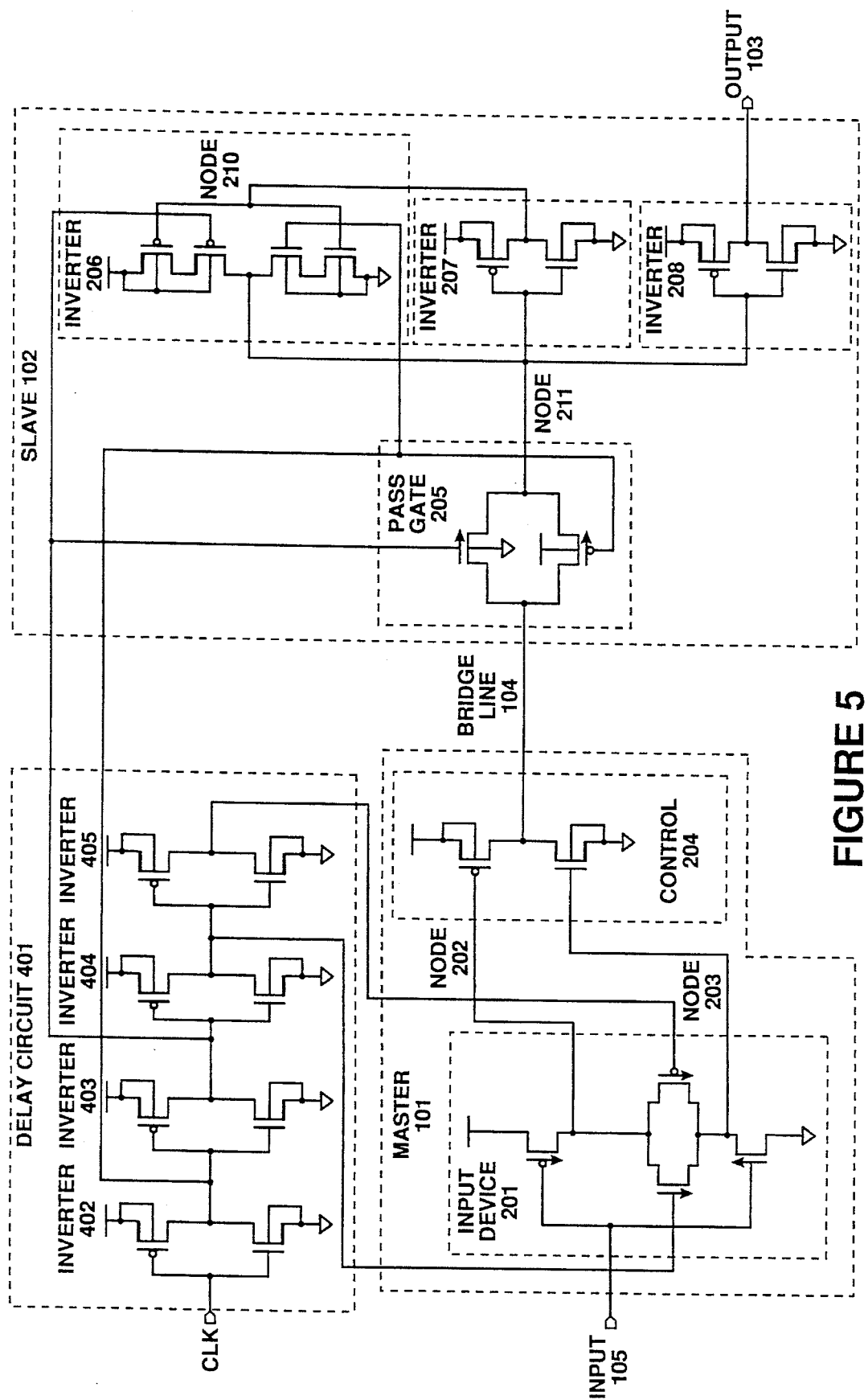
FIG. 5 illustrates in transistor form a flip-flop circuit with a delay circuit.

Under a third embodiment of the present invention, the flip-flop circuit includes a delay circuit as illustrated in FIG. 5. Delay circuit 401 comprises of a number of inverters positioned in series. Four inverters 402, 403, 404 and 405 are used in the third embodiment of the present invention. Inverter 402 is coupled to the clock line on one end and on the other end, inverter 402 is coupled to inverter 403, pass gate 205 and clocked inverter 206. Inverter 403 is coupled to inverter 402 on one end and on the other end, coupled to inverter 404, pass gate 205 and clocked inverter 206. Inverter 404 is coupled to inverter 403 on one end and to pass gate 305 on the other. Finally, inverter 405 is coupled to inverter 404 on one end and to pass gate 305 on the other.

Figure 6:
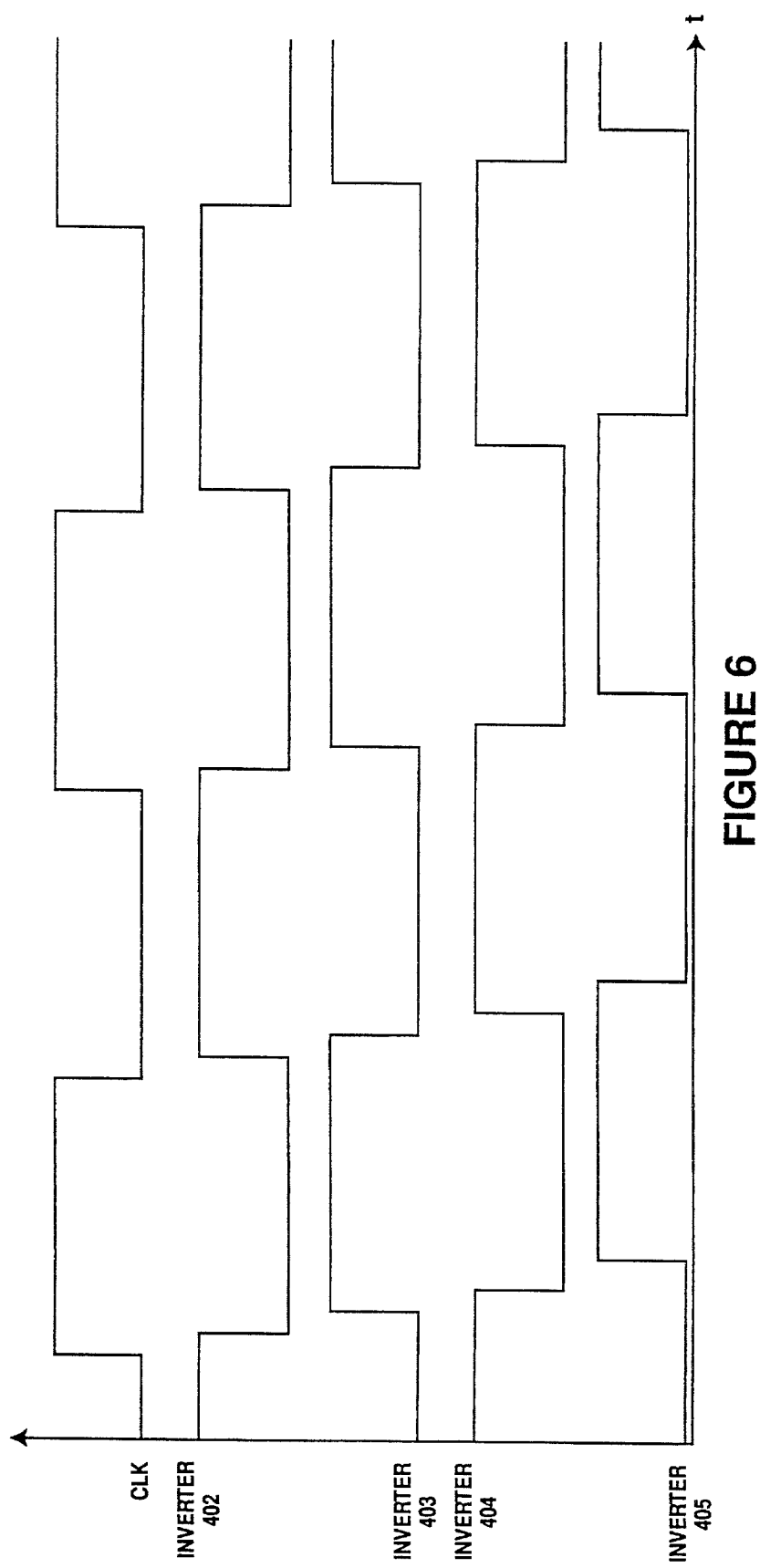
FIG. 6 is a timing diagram of the delay circuit of FIG. 5.

FIG. 6 is a timing diagram illustrating the operation of the delay circuit. As evident from FIG. 6, when the clock signal changes from one clock state to another clock state, the first inverter, inverter 402 changes its output in response to the clock state change. However, there is a delay associated with the change by inverter 402. Inverter 403 then responds to the change by inverter 402. Again, there is a delay associated with the change by inverter 403. Inverter 404 then responds to the change by inverter 403 and finally inverter 405 responds to the change by inverter 404. In this embodiment, clocked inverter 206 is coupled to inverter 403, pass gate 205 in slave portion 102 is also coupled to inverter 403 and pass gate 305 in master portion 101 is coupled to inverter 405. Thus, when the clock signal switches from the low clock state to the high clock state, clocked inverter 206 shuts off and slave portion 102 turns on, then master portion 101 turns off.

It is to be appreciated that slave portion 102 turns on a short time before master portion 101 turns off. Thus, there is a short period of time where both master portion 101 and slave portion 102 are both in the ON state. When slave portion 102 is just turned on, it needs a strong bridge signal to change its signal states to reflect the bridge signal because it has to overcome the existing charge on the gates representing the prior signal state. By leaving master portion 101 ON for a short period, the charge state representing the bridge signal is still being applied to bridge line 104 by control device 204. This results in a stronger signal than in the case where master portion 101 is turned OFF immediately because the charge state would no longer be applied by control device 204 to bridge line 104 when master portion 101 is OFF.

Figure 7:
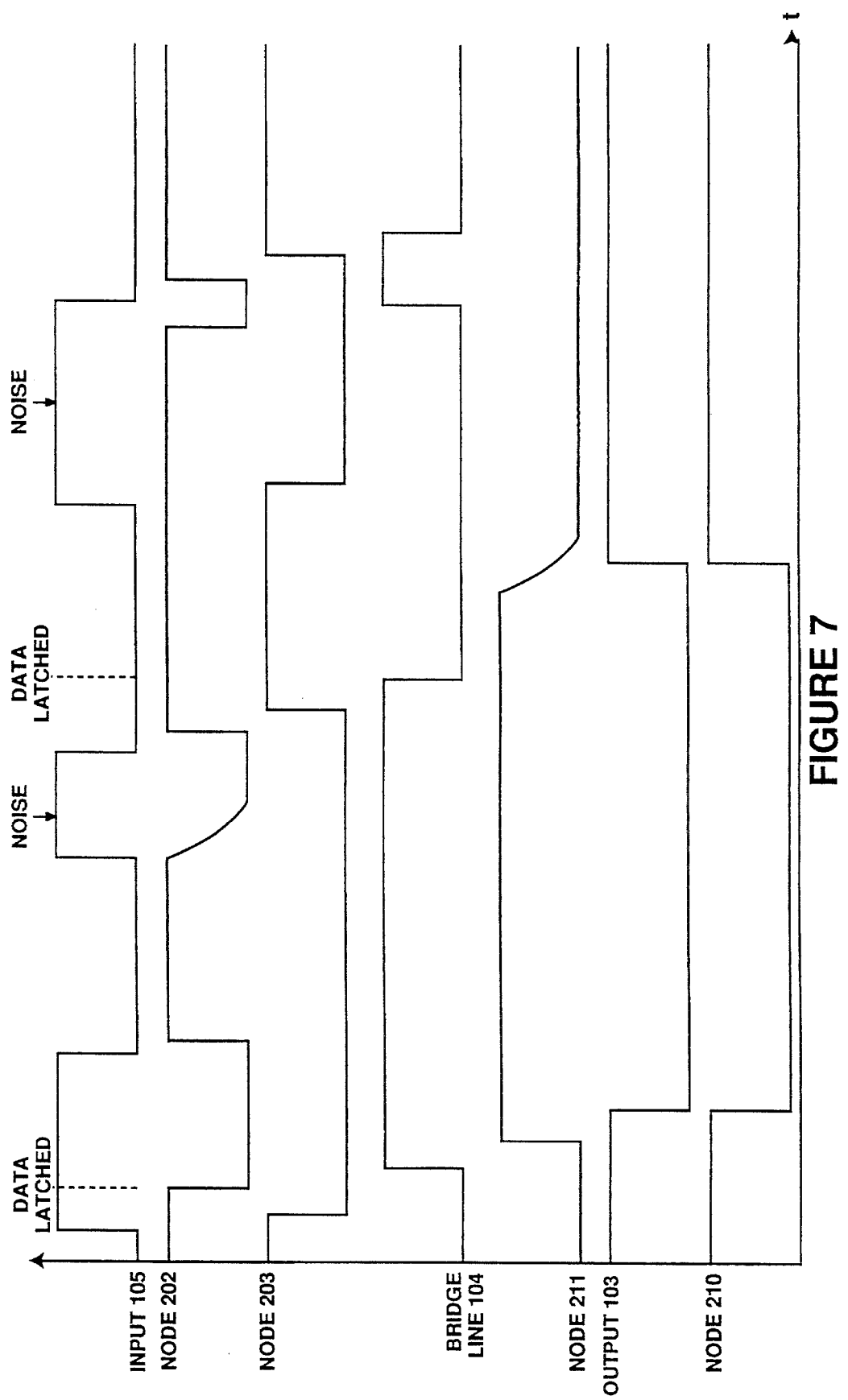
FIG. 7 is a timing diagram of the flip-flop circuit of FIG. 5.

FIG. 7 is a timing diagram illustrating the operation of the flip-flop of the third embodiment of the present invention. The point where data is latched indicates the point in time when the flip-flop is supposed to sample the input signal. Latching of data is accomplished when the clock signal changes from a low clock state to a high clock state. Noise in the input signal indicates changes in the input signal state which are not supposed to affect output 103 because the flip-flop is not supposed to sample the input signal during those changes. Nodes 202 and 203 responds to changes in the clock signal and on input 105. Bridge line 104 in turn responds to changes on nodes 202 and 203. Node 211 responds to changes in the clock signal and bridge line 104. Finally, node 210 and output 103 responds to changes in node 211.

Figure 8:
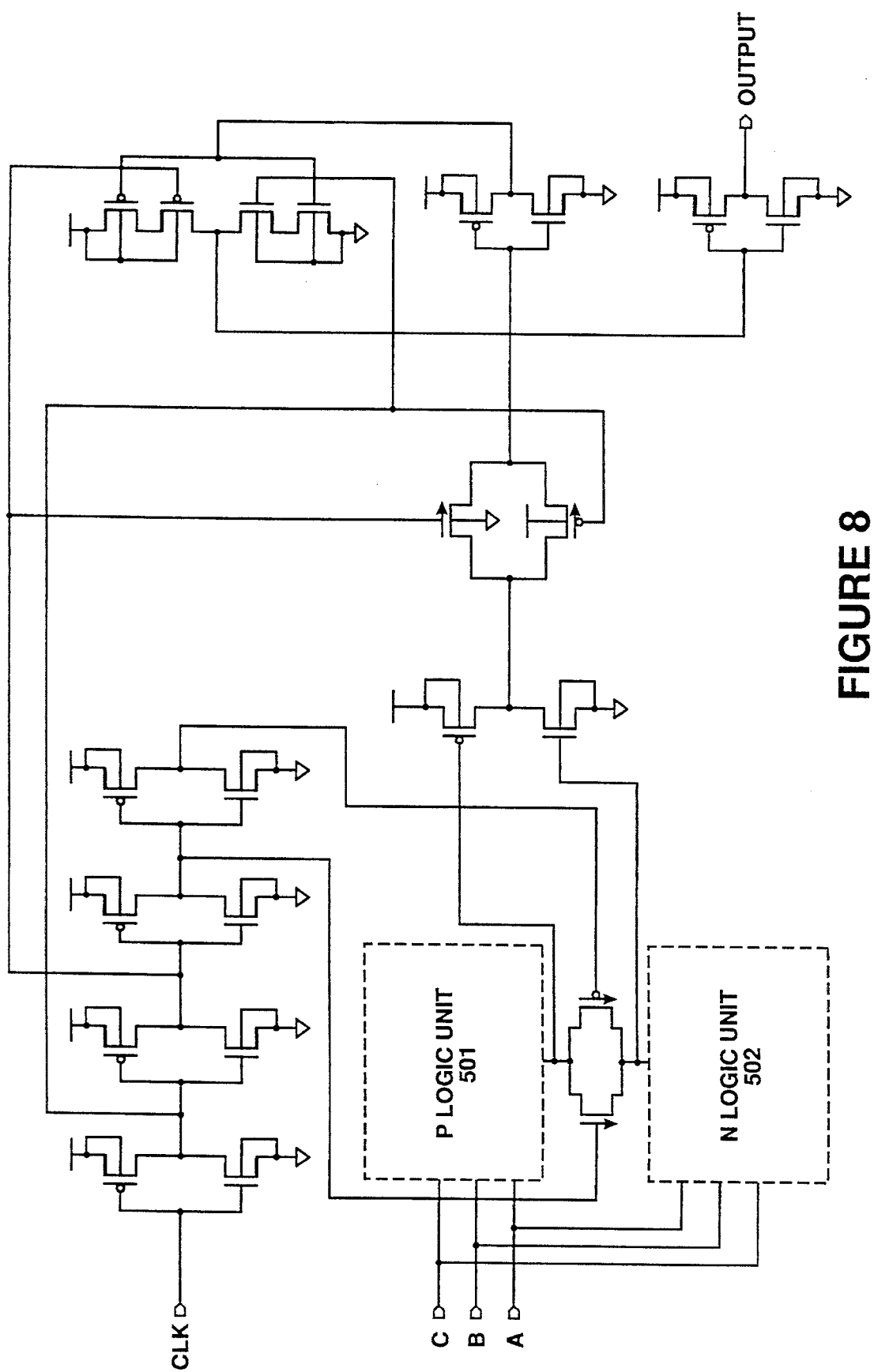
FIG. 8 illustrates a flip-flop circuit with a p logic unit and a n logic unit.
Figure 9:
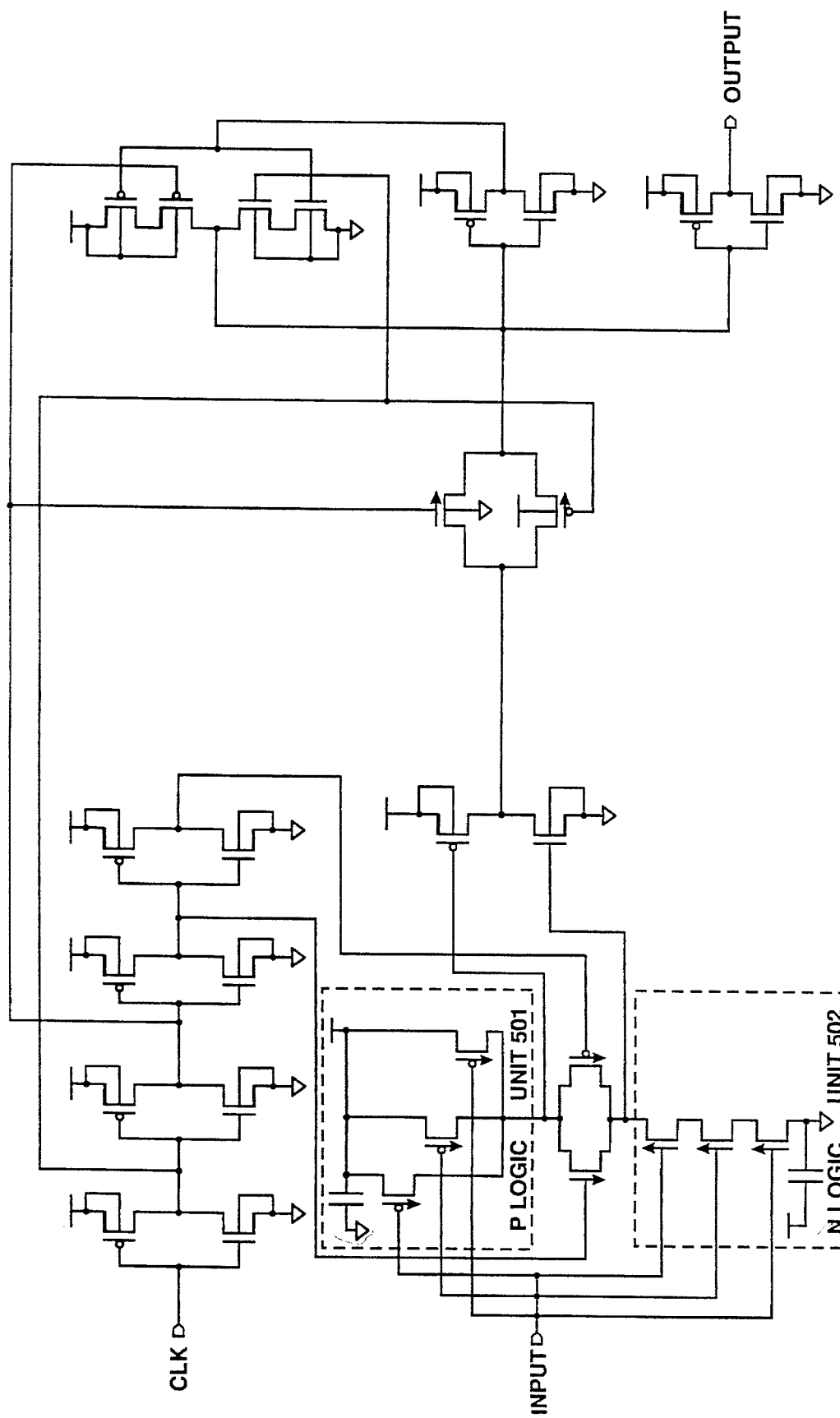
FIG. 9 illustrates in transistor form a flip-flop circuit with an exemplary p logic unit and n logic unit.

Under a fourth embodiment of the present invention, master portion 101 includes a p logic unit and a n logic unit as illustrated in FIG. 8. P logic unit 501 and n logic unit 502 allows logic functions to be merged into the flip-flop circuit. It will be appreciated that p logic unit replaces p channel transistor 301 and n logic unit replaces n channel transistor 302. A circuit with an exemplary p logic unit and n logic unit is illustrated in FIG. 9. In this case, p logic unit 501 comprises of three p channel transistors coupled in a manner to form a three input NAND gate. N logic unit 502 comprises of three n channel transistors coupled in a manner to form a three input NAND gate. When p logic unit 501 and n logic unit 502 are merged into the flip-flop circuit, they incorporate the functions of p channel transistor 301 and n channel transistor 302. Thus, a circuit utilizing the flip-flop of the present embodiment has two less transistors when compared to a circuit where the logic units are positioned outside of the flip-flop. The elimination of the two transistors results in the elimination of the gate delays associated with the transistors and thus, a faster circuit. Thus, a novel flip-flop circuit has been described.

What is claimed is:

1. A flip-flop circuit comprising:

a dynamic master portion containing a first circuit for storing a signal state, said first circuit storing said signal state by maintaining a charge state representing said signal state; and a static slave portion coupled to and responsive to said master portion containing a second circuit for storing a signal state, said second circuit storing said signal state by switching to a voltage potential representing said signal state.

a clock line coupled to said master portion and said slave portion, said clock line carrying a clock signal to control said master portion and said slave portion.

2. The circuit of claim 1 wherein said master portion further comprises an input device for maintaining charge states on a first node in response to an input signal and a clock signal, said input device also maintaining charge states on a second node in response to said input signal and said clock signal.

3. The circuit of claim 2 wherein said input device is comprised of:

a first p channel transistor with a source coupled to a high voltage potential;

a pass gate coupled to said first p channel transistor; and a first n channel transistor with a drain coupled to said pass gate and a source coupled to a low voltage potential.

4. The circuit of claim 3 wherein said pass gate is comprised of:

a second p channel transistor with a gate coupled to a first clock line; and a second n channel transistor with a source and drain coupled to said second p channel transistor and a gate coupled to a second clock line.

5. The circuit of claim 2 wherein said input device is comprised of:

a p logic unit;

a pass gate coupled to said p logic unit;

a n logic unit coupled to said pass gate; and said p logic unit and said n logic unit for incorporating logic functions into said circuit.

6. The circuit of claim 1 wherein said master portion further comprises of:

an input device for applying a charge state to a first node and a second node in response to a first signal state when a clock signal is in a first clock state, said input device applying a second charge state to said first node and said second node in response to a second signal state when said clock signal is in said first clock state.

7. The circuit of claim 1 wherein said master portion further comprises of:

an input device for applying a charge state to a first node and maintaining an existing charge state on a second node in response to a first signal state when a clock signal is in a second clock state, said input device maintaining a previous charge state on said first node and applying a second charge state to said second node in response to a second signal state when said clock signal is in said second clock state.

8. The circuit of claim 1 wherein said master portion further comprises of:

a control device for transmitting a signal in response to a charge state on a node.

9. The circuit of claim 8 wherein said control device is comprised of:

a p channel transistor with a source coupled to a high voltage potential; and a n channel transistor with a source coupled to said p channel transistor and a drain coupled to a low voltage potential.

10. The circuit of claim 1 wherein said master portion further comprises of:

a control device for transmitting a first signal state when a first node and a second node are both in a first charge state, said control device transmitting a second signal state when said first node and said second node are both in a second charge state, said output device maintaining a previous signal state when said first node is in said first charge state and said second node is in said second charge state.

11. The circuit of claim 1 wherein said slave portion further comprises of:

a pass gate preventing a signal to pass in response to a first clock state, said pass gate allowing said signal to pass in response to a second clock state.

12. The circuit of claim 11 wherein said pass gate is comprised of:

a p channel transistor with a gate coupled to a first clock line; and a n channel transistor with a source and drain coupled to said p channel transistor and a gate coupled to a second clock line.

13. The circuit of claim 1 wherein said slave portion further comprises of:

a first inverter coupled to a pass gate, said first inverter positioned in a first direction; and a second inverter coupled to said pass gate and said first inverter, said second inverter positioned in a second direction.

14. The circuit of claim 11 wherein said second inverter causes a third node to switch to a first voltage potential in response to a first signal state and causes said third node to switch to a second voltage potential in response to a second signal state.

15. The circuit of claim 13 wherein said first inverter comprises of a clocked inverter, said clocked inverter applying a first voltage potential to a fourth node in response to a second voltage potential on a third node when a clock signal is in a first clock state, said clocked inverter applying a second voltage potential to a fourth node in response to a first voltage potential on a third node when said clock signal is in said first clock state, said clocked inverter isolating a fourth node when said clock signal is in a second clock state.

16. The circuit of claim 15 wherein said clocked inverter is comprised of:

a first p channel transistor with a source coupled to a high voltage potential;

a second p channel transistor with a source coupled to said first p channel transistor and a gate coupled to a first clock line;

a first n channel transistor with a drain coupled to a drain of said second p channel transistor and a gate coupled to a second clock line; and a second n channel transistor with a drain coupled to a source of said first n channel transistor, a source coupled to a low voltage potential and a gate coupled to a gate of said first p channel transistor.

17. The circuit of claim 13 wherein said first inverter and said second inverter further comprises of:

a p channel transistor with a source coupled to a high voltage potential; and a n channel transistor with a drain coupled to said p channel transistor and a source coupled to a low voltage potential.

18. The circuit of claim 1 wherein said slave portion further comprises of:

a third inverter coupled to a pass gate and coupled to an output line, said third inverter outputting a first signal state in response to a second signal state and outputting said second signal state in response to said first signal state.

19. The circuit of claim 1 wherein said circuit further comprises a delay circuit to delay a clock signal to said master portion.

20. A method for storing signals in a flip-flop circuit comprising:

storing a signal state in a master portion by maintaining a charge state representing said signal state; and storing said signal state in a slave portion by switching to a voltage potential representing said signal state.

21. The method of claim 20 wherein said method further comprises of:

maintaining charge states on a first node in response to an input signal and a clock signal; and maintaining charge states on a second node in response to said input signal and said clock signal.

22. The method of claim 20 wherein said method further comprises of:

applying a first charge state to a first node and a second node in response to a first signal state when a clock signal is in a first clock state; and applying a second charge state to said first node and said second node in response to a second signal state when said clock signal is in said first clock state.

23. The method of claim 20 wherein said method further comprises of:

applying a first charge state to a first node and maintaining a previous charge state on a second node in response to a first signal state when a clock signal is in a second clock state; and maintaining a previous charge state on said first node and applying a second charge state to said second node in response to a second signal state when said clock signal is in said second clock state.

24. The method of claim 20 wherein said method further comprises of:

transmitting a signal in response to a charge state on a node.

25. The method of claim 20 wherein said method further comprises of:

outputting a first signal state when a first node and a second node are both in a first charge state;

outputting a second signal state when said first node and said second node are both in a second charge state; and maintaining a previous signal state when said first node is in said first charge state and said second node is in said second charge state.

26. The method of claim 20 wherein said method further comprises of:

preventing a signal to pass in response to a first clock state; and allowing said signal to pass in response to a second clock state.

27. The method of claim 20 wherein said method further comprises of:

causing a third node to switch to a first voltage potential in response to a first signal state; and causing said third node to switch to a second voltage potential in response to a second signal state.

28. The method of claim 20 wherein said method further comprises of:

applying a first voltage potential to a fourth node in response to a second voltage potential on a third node when a clock signal is in a first clock state, applying a second voltage potential to a fourth node in response to a first voltage potential on a third node when said clock signal is in said first clock state, isolating a fourth node when said clock signal is in a second clock state.

29. The method of claim 20 wherein said method further comprises of:

outputting a first signal state in response to a second signal state; and outputting said second signal state in response to said first signal state.

30. The method of claim 20 wherein said method further comprises of delaying a clock signal to said master portion.

31. A flip-flop circuit for storing signals comprising:

a master means for storing a signal state, said master means storing said signal state by maintaining a charge state representing said signal state; and a slave means coupled to said master means for storing a signal state, said slave means storing said signal state by switching to a voltage potential representing said signal state.

32. The circuit of claim 31 wherein said master means further comprises of:

an input means for maintaining charge states on a first node in response to an input signal and a clock signal, said input means also maintaining charge states on a second node in response to said input signal and said clock signal.

33. The circuit of claim 31 wherein said master means further comprises of:

an input means for applying a first charge state to a first node and a second node in response to a first signal state when a clock signal is in a first clock state, said input means applying a second charge state to said first node and said second node in response to a second signal state when said clock signal is in said first clock state.

34. The circuit of claim 31 wherein said master means further comprises of:

an input means for applying a first charge state to a first node and maintaining a previous charge state on a second node in response to a first signal state when a clock signal is in a second clock state, said input means maintaining a previous charge state on said first node and applying a second charge state to said second node in response to a second signal state when said clock signal is in said second clock state.

35. The circuit of claim 31 wherein said master means further comprises of:

control means for transmitting a signal in response to a charge state on a node.

36. The circuit of claim 31 wherein said master means further comprises of:

control means for transmitting a first signal state when a first node and a second node are both in a first charge state, said control means transmitting a second signal state when said first node and said second node are both in a second charge state, said control means maintaining a previous signal state when said first node is in said first charge state and said second node is in said second charge state.

37. The circuit of claim 31 wherein said slave means further comprises of:

a pass gate means for preventing a signal to pass in response to a first clock state, said pass gate means allowing said signal to pass in response to a second clock state.

38. The circuit of claim 31 wherein said slave means further comprises of:

an inverter means for causing a third node to switch to a first voltage potential in response to a first signal state and causing said third node to switch to a second voltage potential in response to a second signal state.

39. The circuit of claim 31 wherein said slave means further comprises of:

a clocked inverter means for applying a first voltage potential to a fourth node in response to a second voltage potential on a third node when a clock signal is in a first clock state, said clocked inverter means applying a second voltage potential to a fourth node in response to a first voltage potential on a third node when said clock signal is in said first clock state, said clocked inverter means isolating a fourth node when said clock signal is in a second clock state.

40. The circuit of claim 31 wherein said slave means further comprises of:

a third inverter means for outputting a first signal state in response to a second signal state and outputting said second signal state in response to said first signal state.

41. The circuit of claim 31 further comprising a delay means for delaying a clock signal to said master means.

42. The circuit of claim 31 further comprising logic means for incorporating logic functions into said circuit.

43. In a computer system having a processor and memory, a flip-flop circuit comprising:

a dynamic master portion containing a first circuit for storing a signal state, said first circuit storing said signal state by maintaining a charge state representing said signal state; and a static slave portion coupled to and responsive to said master portion containing a second circuit for storing a signal state, said second circuit storing said signal state by switching to a voltage potential representing said signal state.

44. The circuit of claim 43 wherein said master portion further comprises an input device for maintaining charge states on a first node in response to an input signal and a clock signal, said input device also maintaining charge states on a second node in response to said input signal and said clock signal.

45. The circuit of claim 44 wherein said input device is comprised of:

a first p channel transistor with a source coupled to a high voltage potential;

a pass gate coupled to said first p channel transistor; and a first n channel transistor with a drain coupled to said pass gate and a source coupled to a low voltage potential.

46. The circuit of claim 45 wherein said pass gate is comprised of:

a second p channel transistor with a gate coupled to a first clock line; and a second n channel transistor with a source and drain coupled to said second p channel transistor and a gate coupled to a second clock line.

47. The circuit of claim 44 wherein said input device is comprised of:

a p logic unit;

a pass gate coupled to said p logic unit;

a n logic unit coupled to said pass gate; and said p logic unit and said n logic unit for incorporating logic functions into said circuit.

48. The circuit of claim 43 wherein said master portion further comprises of:

an input device for applying a charge state to a first node and a second node in response to a first signal state when a clock signal is in a first clock state, said input device applying a second charge state to said first node and said second node in response to a second signal state when said clock signal is in said first clock state.

49. The circuit of claim 43 wherein said master portion further comprises of:

an input device for applying a charge state to a first node and maintaining a previous charge state on a second node in response to a first signal state when a clock signal is in a second clock state, said input device maintaining a previous charge state on said first node and applying a second charge state to said second node in response to a second signal state when said clock signal is in said second clock state.

50. The circuit of claim 43 wherein said master portion further comprises of:

a control device for transmitting a signal in response to a charge state on a node.

51. The circuit of claim 50 wherein said control device is comprised of:

a p channel transistor with a source coupled to a high voltage potential; and a n channel transistor with a source coupled to said p channel transistor and a drain coupled to a low voltage potential.

52. The circuit of claim 43 wherein said master portion further comprises of:

a control device for transmitting a first signal state when a first node and a second node are both in a first charge state, said control device transmitting a second signal state when said first node and said second node are both in a second charge state, said output device maintaining a previous signal state when said first node is in said first charge state and said second node is in said second charge state.

53. The circuit of claim 43 wherein said slave portion further comprises of:

a pass gate preventing signal to pass in response to a first clock state, said pass gate allowing said signal to pass in response to a second clock state.

54. The circuit of claim 53 wherein said pass gate is comprised of:

a p channel transistor with a gate coupled to a first clock line; and a n channel transistor with a source and drain coupled to said p channel transistor and a gate coupled to a second clock line.

55. The circuit of claim 43 wherein said slave portion further comprises of:

a first inverter coupled to a pass gate, said first inverter positioned in a first direction; and a second inverter coupled to said pass gate and said first inverter, said second inverter positioned in a second direction.

56. The circuit of claim 53 wherein said second inverter causes a third node to switch to a first voltage potential in response to a first signal state and causes said third node to switch to a second voltage potential in response to a second signal state.

57. The circuit of claim 53 wherein said first inverter comprises of a clocked inverter, said clocked inverter applying a first voltage potential to a fourth node in response to a second potential on a third node when a clock signal is in a first clock state, said clocked inverter applying a second voltage potential to a fourth node in response to a first potential on a third node when said clock signal is in said first clock state, said clocked inverter isolating a fourth node when said clock signal is in a second clock state.

58. The circuit of claim 57 wherein said clocked inverter is comprised of:

a first p channel transistor with a source coupled to a high voltage potential;

a second p channel transistor with a source coupled to said first p channel transistor and a gate coupled to a first clock line;

a first n channel transistor with a drain coupled to a drain of said second p channel transistor and a gate coupled to a second clock line; and a second n channel transistor with a drain coupled to a source of said first n channel transistor, a source coupled to a low voltage potential and a gate coupled to a gate of said first p channel transistor.

59. The circuit of claim 55 wherein said first inverter and said second inverter further comprises of:
- a p channel transistor with a source coupled to a high voltage potential; and
- a n channel transistor with a drain coupled to said p channel transistor and a source coupled to a low voltage potential.

60. The circuit of claim 43 wherein said slave portion further comprises of:
- a third inverter coupled to a pass gate and coupled to an output line, said third inverter outputting a first signal state in response to a second signal state and outputting said second signal state in response to said first signal state.

61. The circuit of claim 43 wherein said circuit further comprises a delay circuit to delay a clock signal to said master portion.

* * * * *